United States Patent
Germann et al.

(10) Patent No.: US 9,733,062 B2
(45) Date of Patent: Aug. 15, 2017

(54) SYSTEMS AND METHODS FOR MONITORING COMPONENT STRAIN

(71) Applicant: General Electric Company, Schenectady, NY (US)

(72) Inventors: Bryan J. Germann, Greenville, SC (US); William F. Ranson, Columbia, SC (US)

(73) Assignee: General Electric Company, Schenectady, NY (US)

( * ) Notice: Subject to any disclaimer, the term of this patent is extended or adjusted under 35 U.S.C. 154(b) by 5 days.

(21) Appl. No.: 14/947,009

(22) Filed: Nov. 20, 2015

(65) Prior Publication Data

US 2017/0146334 A1 May 25, 2017

(51) Int. Cl.
| | |
|---|---|
| *G01B 7/16* | (2006.01) |
| *G01R 29/08* | (2006.01) |
| *G01M 5/00* | (2006.01) |
| *G01L 1/14* | (2006.01) |

(52) U.S. Cl.
CPC ............... *G01B 7/16* (2013.01); *G01L 1/146* (2013.01); *G01M 5/0016* (2013.01); *G01M 5/0083* (2013.01); *G01R 29/08* (2013.01)

(58) Field of Classification Search
CPC ....... G01B 7/16; G01R 29/08; G01M 5/0016; G01M 5/0083
USPC ........................................................ 73/763
See application file for complete search history.

(56) References Cited

U.S. PATENT DOCUMENTS

| | | | |
|---|---|---|---|
| 4,526,043 A * | 7/1985 | Boie ...................... | G01B 7/004 361/283.3 |
| 4,859,062 A | 8/1989 | Thurn et al. | |
| 6,078,396 A | 6/2000 | Manzouri | |
| 6,175,644 B1 | 1/2001 | Scola et al. | |
| 7,200,259 B1 | 4/2007 | Gold et al. | |
| 7,204,162 B2 * | 4/2007 | Johnson .................. | G01L 1/144 73/862.628 |
| 7,227,648 B2 | 6/2007 | Weinhold | |
| 7,395,717 B2 * | 7/2008 | DeAngelis .............. | G01L 1/146 73/724 |
| 7,477,995 B2 | 1/2009 | Hovis et al. | |
| 7,509,884 B2 * | 3/2009 | Morimoto ............... | G01L 1/205 73/862.628 |
| 7,533,818 B2 | 5/2009 | Hovis et al. | |
| 7,689,003 B2 | 3/2010 | Shannon et al. | |
| 7,755,683 B2 * | 7/2010 | Sergio ...................... | G01D 5/24 250/208.1 |
| 7,944,008 B2 * | 5/2011 | Parks ...................... | G01L 1/146 257/417 |

(Continued)

*Primary Examiner* — Lisa Caputo
*Assistant Examiner* — Nathaniel T Woodward
(74) *Attorney, Agent, or Firm* — Dority & Manning, P.A.

(57) ABSTRACT

A system for monitoring a component is provided. The system includes an electrical field scanner for analyzing an electrical field across a reference zone, and a processor in operable communication with the electrical field scanner. The reference zone may include a plurality of fiducials configured on the component to influence the electrical field. The processor may be operable for measuring an electrical field value along a mutually-orthogonal X-axis and Y-axis, assembling a zone profile including a data point set according to the measured electrical field value. Methods of using the system are also provided.

20 Claims, 4 Drawing Sheets

(56) References Cited

U.S. PATENT DOCUMENTS

| | | | | |
|---|---|---|---|---|
| 8,004,423 B2* | 8/2011 | Mitchell | ............... | F01D 5/288 340/573.4 |
| 8,121,800 B2* | 2/2012 | Altman | ............... | G01L 1/146 702/52 |
| 8,175,821 B2* | 5/2012 | Nagakubo | ............ | G01L 1/205 702/138 |
| 8,245,578 B2 | 8/2012 | Ranson et al. | | |
| 8,266,971 B1* | 9/2012 | Jones | ............... | G01L 1/146 73/862.046 |
| 8,600,147 B2 | 12/2013 | Iliopoulos et al. | | |
| 9,207,154 B2 | 12/2015 | Harding et al. | | |
| 9,311,566 B2 | 4/2016 | Iliopoulos et al. | | |
| 2006/0016275 A1* | 1/2006 | Gravesen | ............ | G06F 3/044 73/862.042 |
| 2006/0138574 A1* | 6/2006 | Saito | ............... | G01L 1/146 257/417 |
| 2009/0151478 A1* | 6/2009 | Shimomoto | ......... | G01L 1/146 73/862.626 |
| 2010/0162832 A1* | 7/2010 | Brauers | ............ | A61B 5/103 73/862.626 |
| 2012/0017703 A1* | 1/2012 | Ikebe | ............... | B25J 13/083 73/862.626 |
| 2013/0202192 A1 | 8/2013 | Telfer et al. | | |
| 2014/0000380 A1 | 1/2014 | Slowik et al. | | |
| 2014/0267677 A1 | 9/2014 | Ward, Jr. et al. | | |
| 2014/0373594 A1* | 12/2014 | Remez | ............ | G01L 25/00 73/1.08 |

\* cited by examiner

SYSTEMS AND METHODS FOR MONITORING COMPONENT STRAIN

FIELD OF THE INVENTION

The present disclosure relates generally to systems and methods for monitoring component strain, and more particularly to systems and methods which provide electrical field measurements and scans of an exterior surface of the component.

BACKGROUND OF THE INVENTION

Throughout various industrial applications, apparatus components are subjected to numerous extreme conditions (e.g., high temperatures, high pressures, large stress loads, etc.). Over time, an apparatus's individual components may suffer creep and/or deformation that may reduce the component's usable life. Such concerns might apply, for instance, to some turbomachines.

Turbomachines are widely utilized in fields such as power generation and aircraft engines. For example, a conventional gas turbine system includes a compressor section, a combustor section, and at least one turbine section. The compressor section is configured to compress air as the air flows through the compressor section. The air is then flowed from the compressor section to the combustor section, where it is mixed with fuel and combusted, generating a hot gas flow. The hot gas flow is provided to the turbine section, which utilizes the hot gas flow by extracting energy from it to power the compressor, an electrical generator, and other various loads.

During operation of a turbomachine, various components within the turbomachine and particularly within the turbine section of the turbomachine, such as turbine blades, may be subject to creep due to high temperatures and stresses. For turbine blades, creep may cause portions of or the entire blade to elongate so that the blade tips contact a stationary structure, for example a turbine casing, and potentially cause unwanted vibrations and/or reduced performance during operation.

Accordingly, components might be monitored for creep. One approach to monitoring components for creep is to configure strain sensors on the components, and analyze the strain sensors at various intervals to monitor for deformations associated with creep strain. However, such deformation can in many cases be on the order of 0.01% of an original dimension, thus requiring specialized equipment for strain monitoring.

For instance, specialized equipment may be used to obtain visual images of the strain sensors, and compare the dimensions of the strain sensors in images taken at varying times for an associated component. Dimensions along two axes can be directly measured in such images, while dimensions along a third axis may be inferred. However, such approaches may require a direct line of sight to the sensor and component. Moreover, a great deal of space and disassembly may be required in order to measure the component. As a result, in situ measurements can be difficult, if not impossible with most existing systems.

Accordingly, alternative systems and methods for monitoring component strain are desired in the art. In particular, systems and methods that require less space and permit in situ measurements to be made on an assembled apparatus.

BRIEF DESCRIPTION OF THE INVENTION

Aspects and advantages of the invention will be set forth in part in the following description, or may be obvious from the description, or may be learned through practice of the invention.

In accordance with one embodiment of the present disclosure, a system for a component is provided. The system may include an electrical field scanner for analyzing an electrical field across a reference zone, and a processor in operable communication with the electrical field scanner. The reference zone may include a plurality of fiducials configured on the component to influence the electrical field. The processor may be operable for measuring an electrical field value along a mutually-orthogonal X-axis and Y-axis, assembling a zone profile including a data point set according to the measured electrical field value In accordance with another embodiment of the present disclosure, a method for monitoring a component is provided. The method may include the step of measuring an electrical field value across the reference zone along a mutually-orthogonal X-axis and Y-axis at a first time, the reference zone including at least one fiducial configured to influence the electrical field value. The method may further include the step of assembling a first zone profile including a first data point set according to the measured electrical field value.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
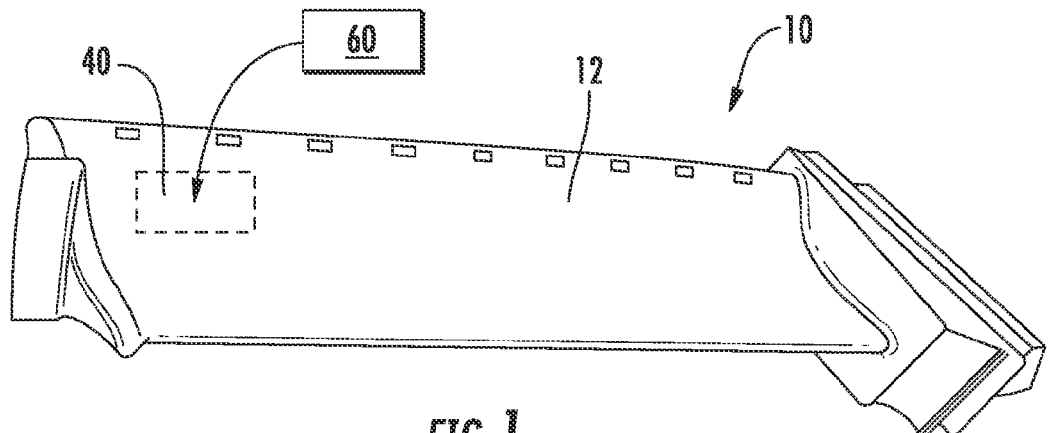
FIG. 1 is a perspective view of an exemplary component including an electrical field scanner and reference zone in accordance with one or more embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 2:
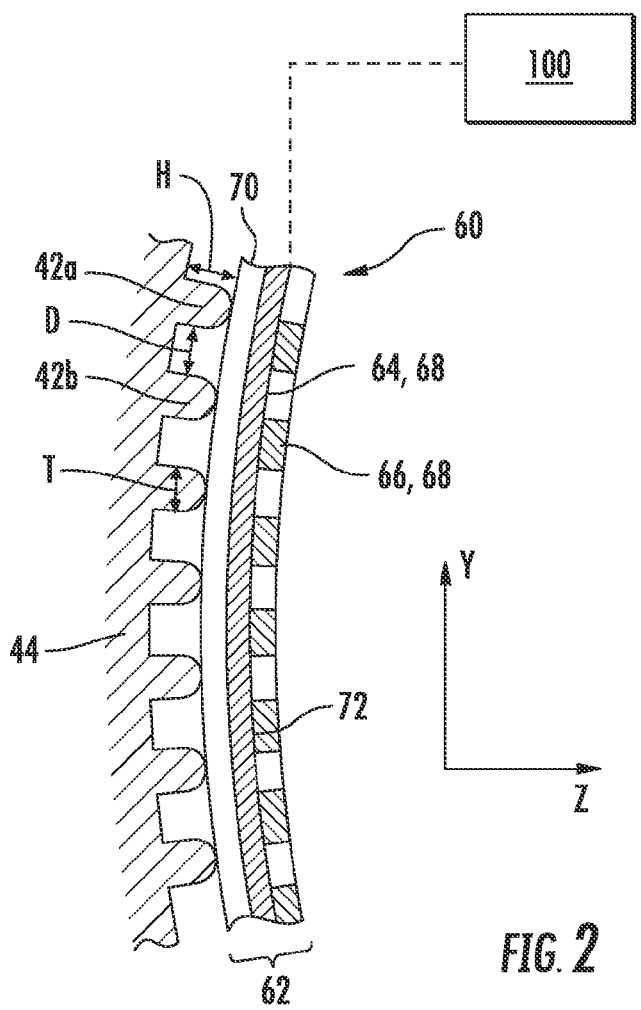
FIG. 2 is a schematic side view of an exemplary component including an electrical field scanner disposed on a component in accordance with one or more embodiments of the present disclosure.

Referring now to FIGS. 1 and 2, a component 10 is illustrated with a reference zone 40 configured on a portion of the component's exterior surface 12. As shown, a field scanner 60 may be disposed over the reference zone 40 and/or exterior surface 12. The example component 10 embodiment shown in FIG. 1 comprises a turbine component including a turbine blade. However, the component 10 (and more specifically the substrate 11 of the overall component 10) can comprise a variety of types of components used in a variety of different applications, such as, for example, components utilized in high temperature applications (e.g., components comprising nickel or cobalt based superalloys). In some embodiments, the component 10 may comprise an industrial gas turbine or steam turbine component such as a combustion component or hot gas path component. In some embodiments, the component 10 may comprise a turbine blade, compressor blade, vane, nozzle, shroud, rotor, transition piece or casing. In optional embodiments, the component 10 may comprise any other component of a turbine such as any other component for a gas turbine, steam turbine or the like. In some embodiments, the component may comprise a non-turbine component including, but not limited to, automotive components (e.g., cars, trucks, etc.), aerospace components (e.g., airplanes, helicopters, space shuttles, aluminum parts, etc.), locomotive or rail components (e.g., trains, train tracks, etc.), structural, infrastructure or civil engineering components (e.g., bridges, buildings, construction equipment, etc.), and/or power plant or chemical processing components (e.g., pipes used in high temperature applications).

As illustrated in FIGS. 2 through 5, the reference zone 40 may include a plurality of fiducials 42. In some embodiments, each fiducial 42 is formed as a protrusion on the exterior surface 12 of the component 10. Generally, each fiducial 42 may be defined in a mutually orthogonal X, Y, and Z-axes. In optional embodiments, each fiducial 42 extends outwardly from a base portion 44 of the component 10. Between each fiducial 42, a spacing distance D may be defined. As a result, each protrusion fiducial 42 includes a height H (e.g., a maximum height) relative to the component base portion 44 and a thickness T (e.g., a maximum thickness) approximately parallel to the base portion 44. In optional embodiments, each fiducial 42 includes multiple height H and thickness T measurements. In some embodiments, each fiducial 42 has a substantially uniform thickness T along its height H. Such embodiments may help facilitate more accurate measurements for subsequent strain calculations between fiducials 42. The height H of each fiducial 42 may be any suitable height that is suitable for subsequent identification without significantly impacting the performance of the underlying component 10. For example, some fiducial 42 embodiments may include a height H of between 0.01 millimeters and 5 millimeters. Additional or alternative fiducial 42 embodiments may include a thickness T of between 0.001 millimeters and 5 millimeters. Moreover, the height H and thickness T of each fiducial 42 may be substantially the same as the other fiducials 42, or distinctive according to a predetermined pattern.

Each fiducial 42 in accordance with the present disclosure may be configured on the component 10 using any suitable techniques, including integral or monolithic formation; deposition techniques; suitable additive manufacturing techniques; or mounting of previously-formed reference zone fiducials 42 using suitable mounting apparatus or techniques such as adhering, welding, brazing, etc. For example, some fiducial 42 embodiments include protrusions formed as integral members may be fixedly attached to and formed on the base portion 44 of the component 10. Optional fiducial 42 embodiments may include one or more capacitance-varied material deposited on or within the component 10. In such embodiments, the capacitance material may have a conductivity or capacitance value that is identifiably unique from the component 10. For instance, the fiducial material may have a capacitance value that is substantially larger than the material which forms the component 10. Alternatively, the fiducial material may have a capacitance value that is substantially smaller than the material which forms the component 10.

In some embodiments of the reference zone 40, the fiducials 42 may be configured as a predetermined pattern on the exterior surface 12 of the component 10. As illustrated an electrical field scanner 60 may be selectively placed over and/or in contact with the fiducials 42 of the reference zone 40 to analyze the reference zone 40. Moreover, a processor 100 may be in operable communication with the electrical field scanner 60 to measure an electrical field value influenced by the fiducials 42 across the reference zone 40, as will be described below.

The reference zone 40 generally comprises at least two fiducials 42a and 42b positioned in a predetermined pattern that includes the spacing distance D between said at least two fiducials 42a and 42b that can be measured at a plurality of time intervals. As should be appreciated to those skilled in the art, these measurements can help determine the amount of strain, strain rate, creep, fatigue, stress, etc. at that region of the component 10. The at least two fiducials 42a and 42b can be disposed at a variety of distances and in a variety of locations depending on the specific component 10 so long as the distance D there between can be measured. Moreover, the at least two fiducials 42a and 42b may comprise circular nodules, elevated fringe ridges, or any other geometrical or non-geometrical shape so long as they are consistently identifiable and may be used to measure the spacing distance D there between. As shown, multiple fiducials 42 at various spacings may be formed in some embodiments. Such embodiments may provide for a greater variety of distance measurements D such as between the outer most fiducials, between two fiducials, or external fiducials, or any combination there between. The greater variety may further provide a more robust strain analysis on a particular portion of the component 10 by providing strain measurements across a greater variety of locations.

The reference zone 40 may be configured in one or more of a variety of locations of various components 10. For example, as discussed above, the reference zone 40 may be configured on a turbine blade, vane, nozzle, shroud, rotor, transition piece or casing. In such embodiments, the reference zone 40 may be configured in one or more locations known to experience various forces during unit operation such as on or proximate airfoils, platforms, tips or any other suitable location. Moreover, the reference zone 40 may be formed in one or more locations known to experience elevated temperatures. For example the reference zone 40 may be configured on a hot gas path or combustion component 10.

In some embodiments, multiple reference zones 40 may be configured on a single component 10 or on multiple components 10. For example, a plurality of reference zones 40 may be configured on a single component 10 (e.g., a turbine blade) at various locations such that the strain may be determined at a greater number of locations about the individual component 10. Alternatively or additionally, a plurality of like components 10 (e.g., a plurality of turbine blades) may each have a reference zone 40 configured in a standard location so that the amount of strain experienced by each specific component 10 may be compared to other like components 10. In even some embodiments, multiple different components 10 of the same apparatus (e.g., turbine blades and vanes for the same turbine) may each have a reference zone 40 configured thereon so that the amount of strain experienced at different locations within an overall apparatus may be determined.

Multiple components 10, or portions of components, may include individualized reference zones 40 have discrete predetermined patterns. In other words, the predetermined pattern of one component 10 or portion may be distinguishable and different from the predetermined reference pattern of another component 10 or portion. This may allow discrete components and/or portions to be identified and tracked throughout the life of the component 10.

The dimensions of the reference zone 40 may depend on, for example, the component 10, the location of the reference zone 40, the targeted precision of the measurement, application technique, and electrical field measurement technique. For example, in some embodiments, the reference zone 40 may comprise a length L and width W ranging from less than 10 millimeters to greater than 300 millimeters.

Figure 3:
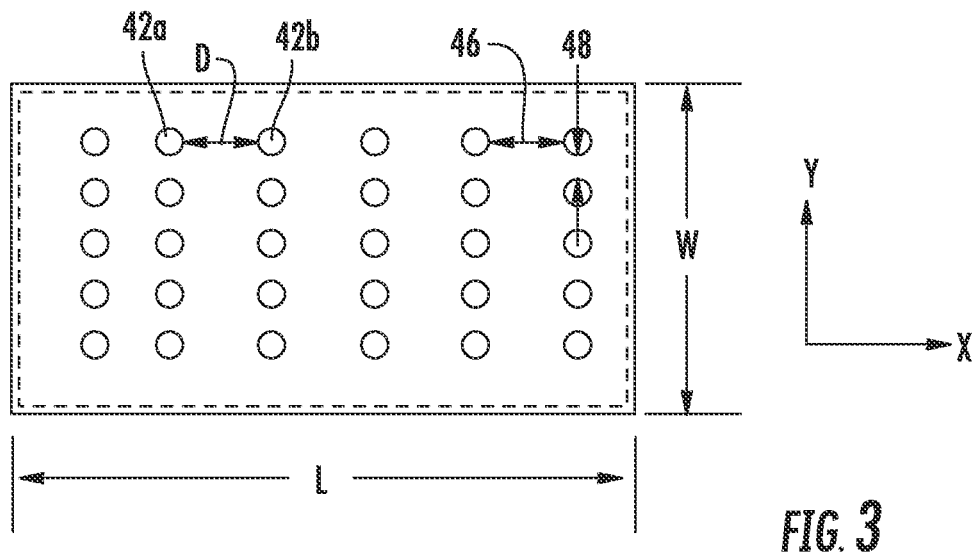
FIG. 3 is an overhead view of a plurality of fiducial markers in accordance with one or more embodiments of the present disclosure.
Figure 4:
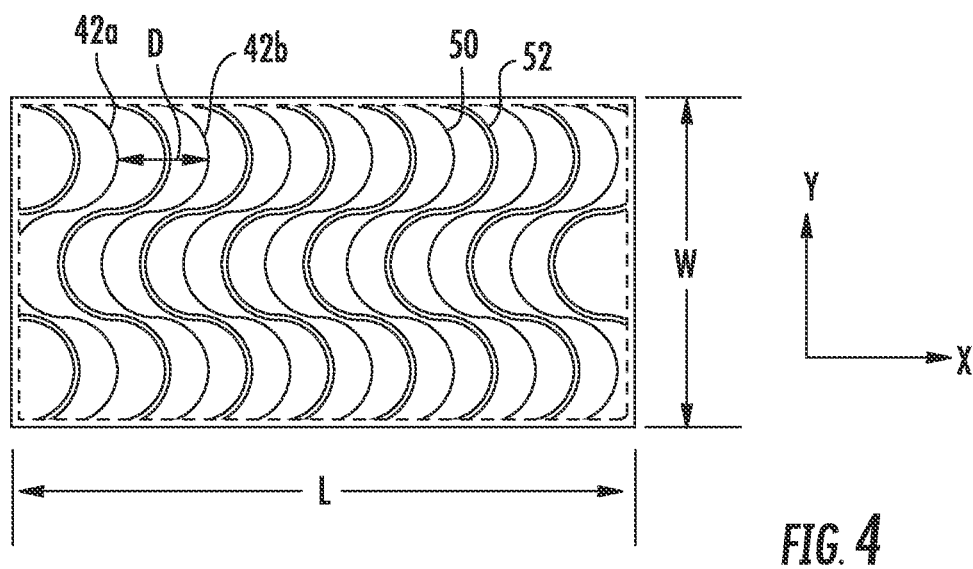
FIG. 4 is an overhead view of a plurality of fiducial markers in accordance with one or more embodiments of the present disclosure.
Figure 5:
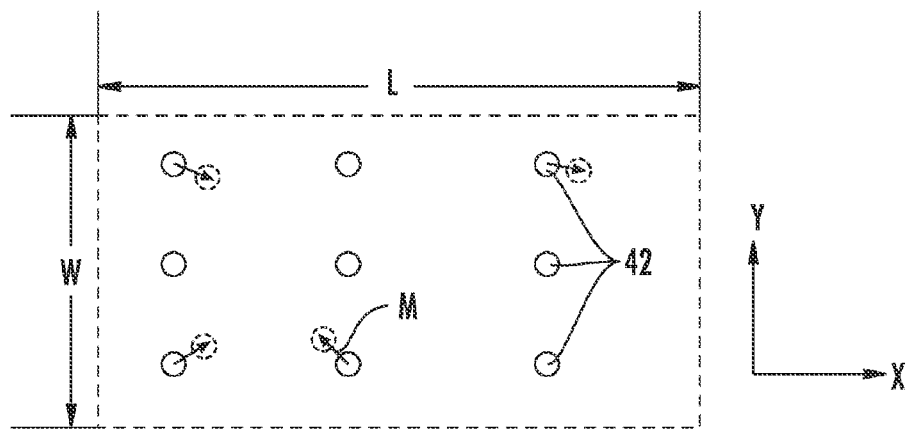
FIG. 5 is an overhead view of a plurality of fiducial markers in accordance with one or more embodiments of the present disclosure.

As shown in FIG. 3, one exemplary embodiment of the reference zone 40 includes a plurality of integrally-formed protrusion nodules. Each nodule may be, therefore, formed from substantially the same material as the component 10. The nodules are arranged in a predetermined matrix pattern along the mutually orthogonal X and Y-axes. The matrix pattern may include a preselected column spacing 46 and a preselected row spacing 48 to define the distance D between each adjacent nodule. Similarly, in the exemplary embodiment of FIG. 4, the reference zone 40 includes a plurality of protrusion fringe ridges. The fringe ridges are arranged in a predetermined wave pattern along the mutually orthogonal X and Y-axes. The wave pattern includes a preselected wave spacing defining the distance D between each adjacent wave. Moreover, each wave fiducial 42 may have an elevated crest in the Z-axis relative to a valley 52 to create variation in protrusion height. As illustrated in FIG. 5, movement M the reference zone 40 may be tracked in each axis as the system measures the relative displacement of each fiducial 42, and, thereby, the deformation of the component 10. In addition, in embodiments including a predetermined pattern, measured pre-use deviations from the predetermined pattern may be observed or detected as indicia of faults in the component and/or component manufacturing process.

Figure 6:
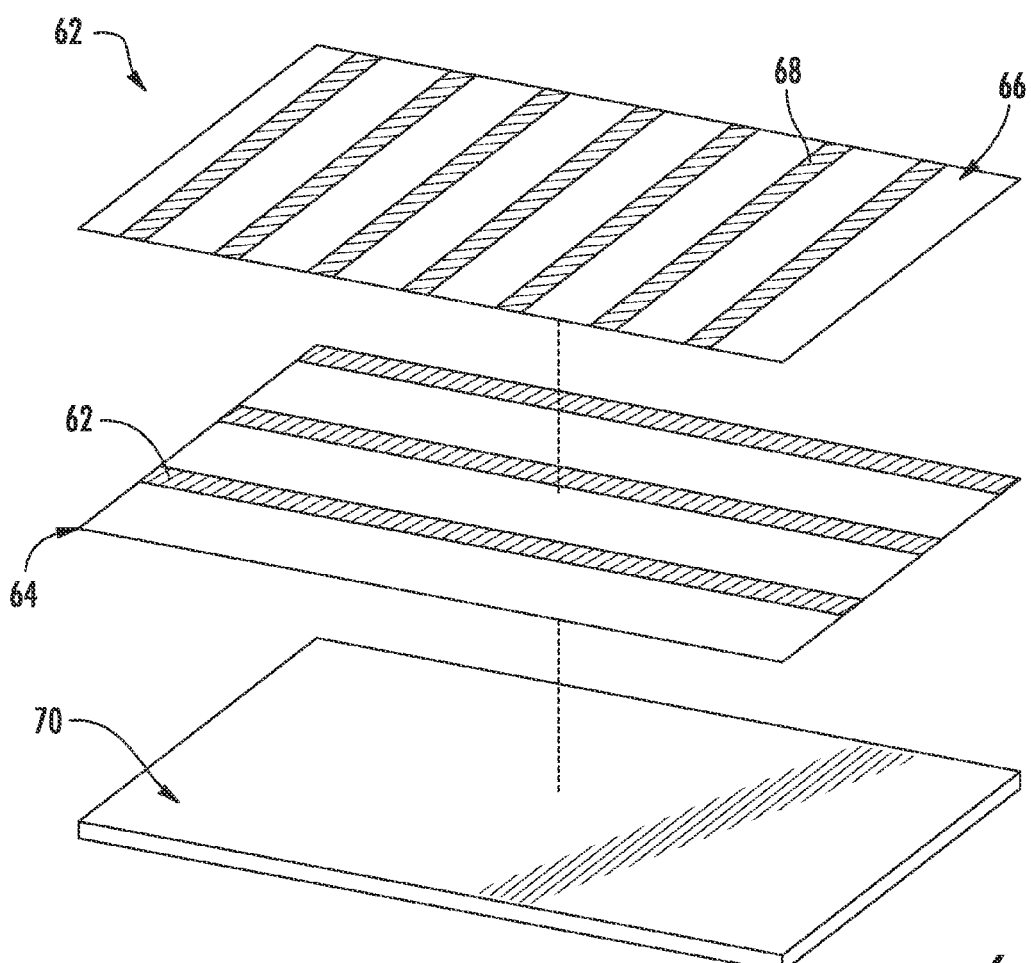
FIG. 6 is an exploded schematic view of an exemplary electrical scanner embodiment in accordance with one or more embodiments of the present disclosure.

Referring now to FIGS. 2 and 6, the electrical field scanner 60 is configured to analyze an electrical field across the reference zone 40. As illustrated in FIG. 2, the electrical field scanner 60 may be positioned over the reference zone 40 and component 10 along a mutually-orthogonal X-axis and Y-axis. In optional embodiments, the electrical field scanner 60 may be placed in direct contact with one or more fiducial 42. As such, the electrical field scanner 60 may be substantially parallel to the component 10 in a Z-axis orthogonal to the X and Y-axes. During use, the electrical field scanner 60 may analyze an electrical field influenced by the fiducials 42 across the reference zone 40. A processor 100 may be operably connected to the electrical field scanner 60 and operable to measure the electrical field and assemble a corresponding zone profile. Specifically, the processor 100 may be operable for measuring an electrical field value along the mutually-orthogonal X-axis and Y-axis, and assembling a zone profile including a data point set according to the measured electrical field value. Optionally, the data point set may include an X-axis data point set and a Y-axis data point set.

In general, as used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 100 may also include various input/output channels for receiving inputs from and sending control signals to various other components with which the processor 100 is in communication, such as the electrical field scanner 60. The processor 100 may further include suitable hardware and/or software for storing and analyzing inputs and data from the electrical field scanner 60 and for generally performing method steps, as described herein.

In general, the processor 100 is operable for measuring the reference zone 40 along a mutually orthogonal X-axis and Y-axis. The processor 100 may measure electrical field values from the signal along the X-axis and Y-axis to obtain X-axis data points and/or Y-axis data points that at least partially form a data point set. In some embodiments wherein both X-data points and Y-data points are obtained, the data point set can include an X-axis data point set and a Y-axis data point set. As noted above, the electrical field values may be influenced by the presence and/or location of the fiducials 42. Optionally, the processor 100 may be operable for identifying one or more fiducials. In some embodiments, the processor 100 may identify discrete electrical field values associated with each fiducial.

In some additional or alternative embodiments, the processor 100 is further operable for calculating Z-axis data points as part of a Z-axis data point set in a Z-axis. The X-axis data points, Y-axis data points, and Z-axis data points are dimensional data points related to the measurement of the reference zone 40. For example, the data points may indicate the location of the surface and/or fiducials 42 in one or more axes relative to a reference surface such as the exterior surface 12 of the component 10, or relative to each other.

The processor 100 may also be operable for assembling one or more zone profile based on a data point set. Optionally, the data point set may include a discrete X-axis data point set and Y-axis data point set. In some embodiments, the processor 100 is further operable for assembling one or more three-dimensional profile of the reference zone 40 based on an X-axis data point set, a Y-axis data point set, and a Z-axis data point set. Zone profiles can be measured and assembled at different times for the associated component 10, such as before use in a turbomachine or other operational use and after a period of such use or after varying periods of such use. Dimensional differences in the profiles can then be measured and utilized in, for example, subsequent strain calculation.

As shown in FIGS. 2 and 6, an exemplary electrical field scanner 60 embodiment will be described. Specifically, the electrical field scanner 60 may include a capacitance scanner for detecting variations in the capacitance electrical field across the reference zone 40. Such embodiments may be configured to analyze and identify multiple points, protrusions, and/or fiducials 42 coming into contact with the scanner 60. For instance, an exemplary capacitance scanner may include a multi-layer capacitance grid 62. In such embodiments, two perpendicular electrode layers 64 and 66 may be joined to one or more substrate 70 to facilitate directly analyzing points across the X-axis and the Y-axis. As shown, a first electrode layer 64 includes a plurality of mutually-parallel detection electrodes 68 extending in the same direction. A second electrode layer 66 includes a plurality of mutually-parallel detection electrodes 68 extending in the same direction orthogonal to the direction of the first electrode layer 64. Both electrode layers 64 and 66 may be positioned adjacent to each other in attachment with a uniform substrate 70. In some embodiments, one or more separator layer (not shown) may be positioned between the electrode layers 64 and 66, preventing potential interference therebetween.

In some embodiments, the uniform substrate 70 may be formed from a flexible material and configured to permit substantial elastic deformation. During use, the capacitance scanner may be non-destructively deformed to substantially match the shape of the component 10 and/or exterior surface 12. In optional embodiments, the substrate 70 includes a flexible sheet formed from polyethylene terephthalate.

The detection electrodes 68 may be formed from one or more conductive material to be deposited on the uniform substrate 70. In some embodiments this includes iridium tin oxide, or another suitable material. In such embodiments the electrode layers may 64, 66 be attached or deposited onto the uniform substrate 70 using a suitable sputtering technique. When assembled, multiple intersections 72 will occur on points where the electrodes 68 of the first layer 64 overlap with the electrodes 68 of the second layer 66. In such embodiments, capacitance may be detected at the various intersection points 72 to create a grid-like capacitance image. The capacitance scanner may include any resolution that is suitable for detecting movements M and variations in the fiducials 42. For example, the capacitance scanner of some embodiments has a resolution between 200 points per inch and 1000 points per inch in the X-axis and Y-axis.

Optionally, the electrical scanner 60 may utilize mutual capacitance to detect geometric variations in the fiducials 42. Accordingly, the first electrode layer 64 may be, for example, transmitting electrodes, while the second electrode layer 66 may be receiving electrodes. The electrodes 68 of the first layer 64 may thus be pulsed in turn, and the electrodes 68 of the second layer 66 may be measured for capacitance changes where a fiducial 42 contacts the scanner 60. A change at any particular X, Y intersection point 72 is correlated to a particular location. When such change is sensed, a signal is sent to the processor 100, which measures the signal and establishes an electrical field value based on this signal. Each intersection point value may be organized into an X-axis data point set and a Y-axis data point set. In optional embodiments, the variations and overall capacitance field strength may be utilized to calculate Z-axis data points indicative of the sensor's distance from the array 66. As mentioned, the data points may be collected into respective X-axis, Y-axis, and Z-axis data point sets.

As also mentioned, after X-axis data points and Y-axis data points are obtained for a reference zone 40, a zone profile of the reference zone 40, including the fiducials 42, may be assembled, such as by the processor 100. Accordingly, the zone profile may be based on the data point set. Moreover, the data point set may include one or more of an X-axis data point set or a Y-axis data point set. For example, processor 100 may collect the data points and output a plot of all data points along relative X and Y-axes. Optional embodiments may further include calculated Z-axis data points and data point set, allowing an output plot of all data points along relative, X, Y, and Z-axes.

Further, multiple zone profiles may be compared, such as by the processor 100. For example, differences in the locations along the X-axis, the Y-axis, and (in optional embodiments) the Z-axis of various features of the reference zone 40 between multiple profiles may be observed and measured for use in subsequent strain calculations. Further, such strain calculations may be performed.

In exemplary embodiments, each profile of a reference zone 40 which is compared to another profile is based obtained X-axis data points and Y-axis data points obtained at a different time for the component 10. For example, a first zone profile may be based on a data point set obtained at a first time, and a second zone profile may be based on a data point set obtained at a second time. The first time may occur before use in service in a turbomachine or other operation, or may occur after a certain amount of such operation. The second time may occur after a certain amount of such operation and, in exemplary embodiments, after first time has occurred. For example, a first time may be zero, for a newly manufactured component 10, and a second time may occur after a particular period of time of service of the component 10. By measuring the reference zone 40 at these varying times, deformation, etc. and resulting strain due to use of the component 10 in service may be calculated.

Figure 7:
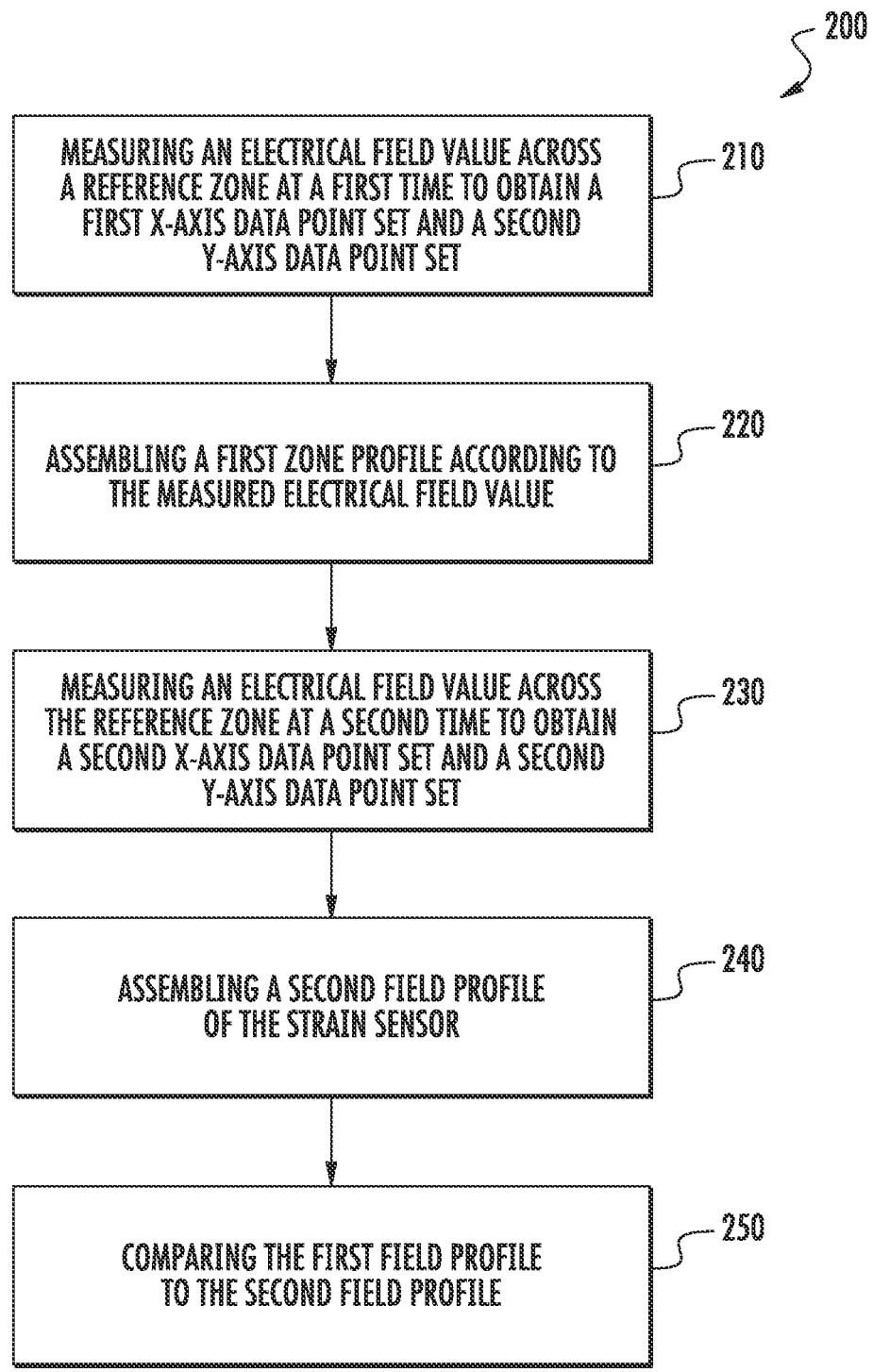
FIG. 7 is a flow chart illustrating a method for monitoring component deformation in accordance with one or more embodiments of the present disclosure.

As mentioned, and referring now to FIG. 7, the present disclosure is additionally directed to methods 200 for monitoring component 10 deformation. Such methods 200 in exemplary embodiment may be performed by processors 100, as discussed above. A method 200 may include, for example, the step 210 of measuring an electrical field value across a reference zone 40 along a mutually-orthogonal X-axis and Y-axis to obtain a first data point set, e.g., a first X-axis data point set and a first Y-axis data point set. The measuring step 210 may include measuring a capacitance field at a capacitance scanner. As described above, the scanner 60 may be placed in direct contact with the exterior surface 12 and/or fiducials 42. Moreover, the scanner 60 may be non-destructively deformed or bent to match a contour of the exterior surface 12.

The method 200 further includes the step 220 of assembling a first zone profile of the reference zone 40 based on the first data point set. Optionally, the step 220 and may include calculating a first Z-axis data point set in a Z-axis orthogonal to the X-axis and the Y-axis, the calculating being based on the first X-axis data point set and the first Y-axis data point set. In such embodiments, the step 230 may include assembling a first three-dimensional profile of the reference zone 40 based on the first X-axis data point set, the first Y-axis data point set, and the first Z-axis data point set.

Step 210 may occur at a first time, and the zone profile may be based on the X-axis data point set and Y-axis data point set at the first time, as discussed above. Method embodiment 200 may, thus, further include, for example, the step 230 of measuring the reference zone 40 along the X-axis and the Y-axis at a second time to obtain a second data point set, e.g., a second X-axis data point set and a second Y-axis data point set, as discussed above. The second time may be different from, and in exemplary embodiments after, the first time. Further, method 200 may include, for example, the step 240 of assembling a second zone profile of the zone sensor based on the X-axis data points and Y-axis data points at the second time, as discussed above. Still further, method 200 may include, for example, the step 250 of comparing the first three-dimensional profile and the second three-dimensional profile, as discussed above.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for monitoring a turbine component, the system comprising:
    an enclosed electrical field scanner for analyzing an electrical field across a reference zone, the reference zone including a plurality of fiducials configured on an exterior turbine surface of the component to influence the electrical field, wherein each fiducial is formed on the exterior turbine surface, and wherein the electrical field scanner is removably disposed over the reference zone; and
    a processor in operable communication with the electrical field scanner, the processor operable for measuring an electrical field value along a mutually-orthogonal X-axis and Y-axis, and assembling a zone profile including a data point set according to the measured electrical field value.

2. The system of claim 1, wherein the electrical field scanner includes a capacitance scanner configured to measure capacitance across the reference zone.

3. The system of claim 2, wherein the capacitance scanner includes a multi-layer capacitance grid having a pair of perpendicular electrode layers.

4. The system of claim 2, wherein the capacitance scanner includes a flexible uniform substrate supporting at least one detection electrode.

5. The system of claim 2, wherein the capacitance scanner has a resolution between 200 points per inch and 1000 points per inch in the X-axis and Y-axis.

6. The system of claim 1, wherein each fiducial includes a protrusion formed on the exterior turbine surface of the component.

7. The system of claim 6, wherein the protrusions include an integrally-formed nodule.

8. The system of claim 6, wherein the protrusions include a plurality of fringe ridges.

9. The system of claim 1, wherein the processor is further operable for comparing multiple zone profiles.

10. A method for monitoring a turbine component, the method comprising:
    measuring an electrical field value across a reference zone along a mutually-orthogonal X-axis and Y-axis at a first time, the reference zone including a plurality of fiducials configured on an exterior turbine surface of the component to influence the electrical field value, wherein measuring includes the removably placing an electrical field scanner over the reference zone; and
    assembling a first zone profile including a data point set according to the measured electrical field value.

11. The method of claim 10, wherein the measuring step includes measuring changes in capacitance across the reference zone.

12. The method of claim 10, wherein the measuring step includes calculating a Z-axis data point set in a Z-axis orthogonal to the X-axis and the Y-axis, and
    wherein the assembling step includes assembling a three-dimensional zone profile of the reference zone based on an X-axis data point set, a Y-axis data point set, and the Z-axis data point set.

13. The method of claim 12, wherein the fiducials include a plurality of fringe ridges,
    wherein the measuring step includes removably engaging the ridges with a capacitance scanner and identifying variations in capacitance at the scanner, and
    wherein the calculating step includes determining a Z-axis data value according the variations in capacitance.

14. The method of claim 12, wherein the fiducials includes a plurality of nodules formed as a matrix grid,
    wherein the measuring step includes removably engaging the nodule with a capacitance scanner and identifying variations in capacitance at the scanner, and
    wherein the calculating step includes determining a Z-axis data value according the variations in capacitance.

15. The method of claim 10, wherein the measuring step includes placing the electrical field scanner on the component in direct contact with the reference zone.

16. The method of claim 15, wherein placing the electrical field scanner includes selectively deforming the scanner to match a contoured shape of the exterior turbine surface.

17. The method of claim 16, wherein the electrical field scanner includes a flexible substrate supporting at least one detection electrode; and wherein selectively deforming includes non-destructively bending the scanner.

18. The method of claim 10, wherein the measuring step occurs at a first time, and the method further comprises:
    measuring an electrical field value across the reference zone at a second time, the second time being different from the first time; and
    assembling a second zone profile including a second data point set according to the measured electrical field value.

19. The method of claim 18, further comprising comparing the first zone profile and the second zone profile.

20. A system for monitoring a component, the system comprising:
    an enclosed electrical field scanner for analyzing an electrical field across a reference zone, the reference zone including a plurality of fiducials configured on an exterior surface of the component to influence the electrical field, wherein each fiducial is formed on the exterior surface, wherein the exterior surface is an outermost surface facing outward and exposed to a surrounding ambient environment, and wherein the electrical field scanner is removably disposed over the reference zone; and
    a processor in operable communication with the electrical field scanner, the processor operable for measuring an electrical field value along a mutually-orthogonal X-axis and Y-axis, and assembling a zone profile including a data point set according to the measured electrical field value.

* * * * *